United States Patent
Matsuoka et al.

(10) Patent No.: US 8,996,966 B2
(45) Date of Patent: Mar. 31, 2015

(54) ERROR CORRECTION DEVICE AND ERROR CORRECTION METHOD

(71) Applicant: Kabushiki Kaisha Toshiba, Minato-ku (JP)

(72) Inventors: Teruyuki Matsuoka, Yokohama (JP); Yukio Ishikawa, Yokohama (JP); Tsuyoshi Ukyou, Yokohama (JP); Fuying Yang, Kawasaki (JP); Toshihiko Kitazume, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 64 days.

(21) Appl. No.: 13/957,672

(22) Filed: Aug. 2, 2013

(65) Prior Publication Data
US 2015/0039975 A1    Feb. 5, 2015

Related U.S. Application Data

(60) Provisional application No. 61/769,955, filed on Feb. 27, 2013.

(51) Int. Cl.
*H03M 13/00* (2006.01)
*H03M 13/15* (2006.01)
*G06F 11/08* (2006.01)

(52) U.S. Cl.
CPC ............. *H03M 13/151* (2013.01); *G06F 11/08* (2013.01)
USPC .......................................................... 714/781

(58) Field of Classification Search
CPC .......... H03M 13/1525; H03M 13/159; H03M 13/3715; H03M 13/3746; H03M 13/1545; H03M 13/1515; H03M 13/152; H03M 13/2927; H03M 13/19; H03M 13/2906; H03M 13/09; G06F 11/10; G06F 11/1068; G06F 1/3225; G06F 1/3275; G06F 11/1048; Y02B 60/1225
See application file for complete search history.

(56) References Cited

U.S. PATENT DOCUMENTS

| | | | |
|---|---|---|---|
| 4,494,234 A | 1/1985 | Patel | |
| 5,428,628 A | 6/1995 | Hassner et al. | |
| 6,119,262 A | 9/2000 | Chang et al. | |
| 2008/0163033 A1 | 7/2008 | Yim | |
| 2009/0222708 A1* | 9/2009 | Yamaga | 714/773 |
| 2010/0058146 A1* | 3/2010 | Weingarten et al. | 714/773 |

(Continued)

FOREIGN PATENT DOCUMENTS

| | | |
|---|---|---|
| JP | 2-301328 | 12/1990 |
| JP | 2001-196938 | 7/2001 |
| JP | 2008-165808 | 7/2008 |

*Primary Examiner* — Guerrier Merant

(74) *Attorney, Agent, or Firm* — Oblon, McClelland, Maier & Neustadt, L.L.P.

(57) ABSTRACT

According to one embodiment, an error correction device includes a syndrome processing unit, a generation unit, and a search processing unit. The syndrome processing unit generates a syndrome value based on received data. The generation unit generates t (t is a maximum number of correctable bits) coefficient values of an error position polynomial based on the syndrome value. The search processing unit calculates a root of the error position polynomial, with a concurrency of computation being equal to or greater than "2", by using the coefficient values of the error position polynomial, when a number of error bits is not more than a predetermined value s ($1 \leq s < t$). The search processing unit calculates the root of the error position polynomial, with a concurrency of computation being "1", when the number of error bits exceeds the predetermined value s.

9 Claims, 9 Drawing Sheets

(56) References Cited

U.S. PATENT DOCUMENTS

| | | | |
|---|---|---|---|
| 2011/0239094 A1* | 9/2011 | Kwok et al. | 714/782 |
| 2012/0240013 A1* | 9/2012 | Wong et al. | 714/782 |
| 2012/0246526 A1* | 9/2012 | Dror | 714/704 |
| 2012/0290901 A1* | 11/2012 | Kong et al. | 714/781 |
| 2013/0080863 A1* | 3/2013 | Hida et al. | 714/784 |

* cited by examiner

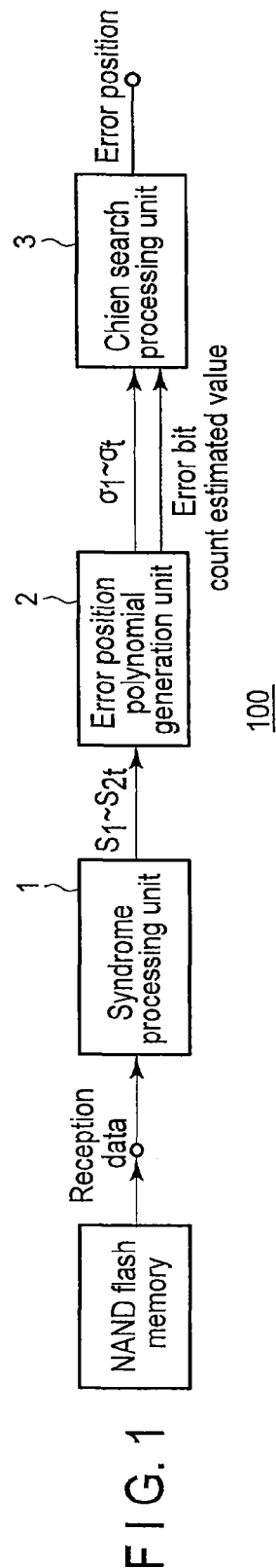

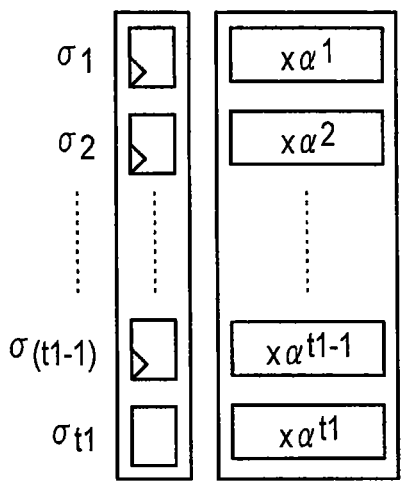
F I G. 5A
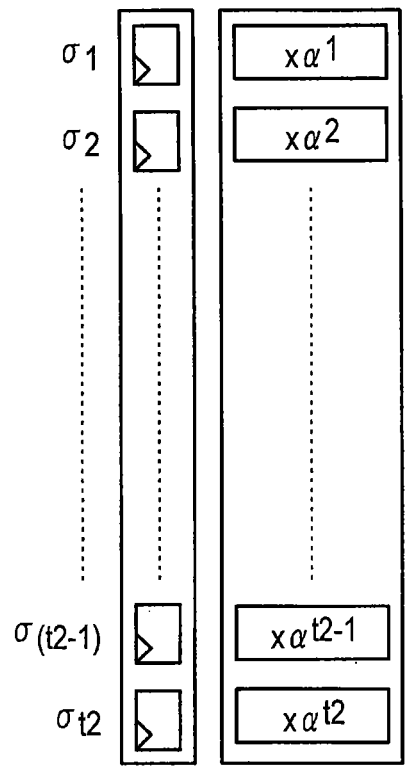
F I G. 5B

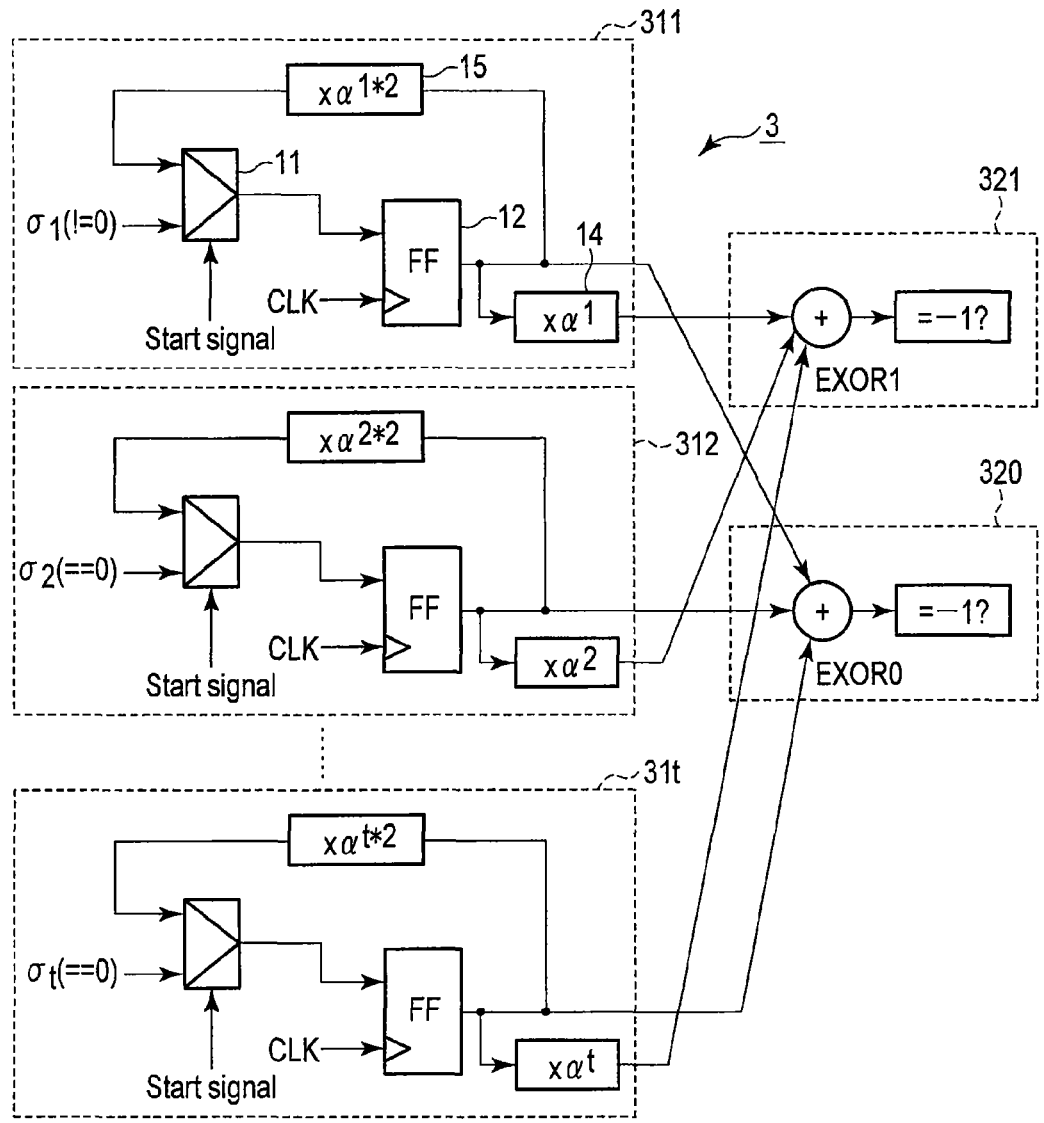
F I G. 6

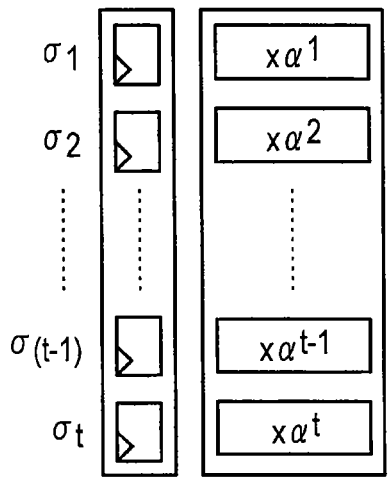
F/F Multiplier with concurrency 1
F I G. 7A
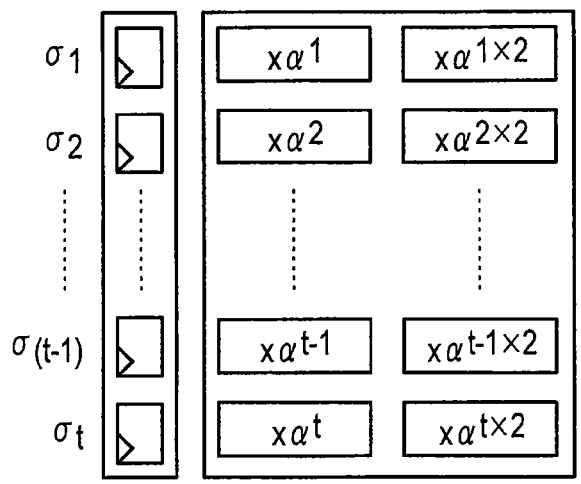
F/F Multiplier with concurrency 2
F I G. 7B

ERROR CORRECTION DEVICE AND ERROR CORRECTION METHOD

CROSS-REFERENCE TO RELATED APPLICATIONS

This application claims the benefit of U.S. Provisional Application No. 61/769,955, filed Feb. 27, 2013, the entire contents of which are incorporated herein by reference.

FIELD

Embodiments described herein relate generally to an error correction device and an error correction method which are used for a semiconductor storage device, for example, a NAND flash memory, and a semiconductor device.

BACKGROUND

For example, the data read out from a NAND flash memory or the like sometimes includes one or more errors. For this reason, the controller of the semiconductor storage device is equipped with an error correction device.

Recently, with advances in process miniaturization, it is necessary to improve the correction performance of NAND flash memories. That is, it is necessary to increase the maximum number of bits which can be corrected. This leads to an increase in the circuit size of an error correction device and an increase in current consumption. Demands have therefore arisen for an error correction device and an error correction method which prevent increases in circuit size and current consumption.

BRIEF DESCRIPTION OF THE DRAWINGS

FIG. 1 is a block diagram showing the schematic arrangement of an error correction device to which an embodiment is applied;

FIG. 2 is a view showing the relationship between the number of error bits estimated values and sigma values $\sigma_1$ to $\sigma_t$;

FIG. 5A is a schematic view showing a case in which when the maximum number of bits is t1 at concurrency "1", and FIG. 5B is a schematic view showing a case in which the maximum number of bits is increased to t2 (t1<t2) at concurrency "1";

FIG. 6 is a circuit diagram showing the arrangement of another example of the Chien search processing unit;

FIG. 7A is a schematic view showing a Chien search processing unit with concurrency "1", and FIG. 7B is a schematic view showing a Chien search processing unit with concurrency "2";

DETAILED DESCRIPTION

Figure 3:
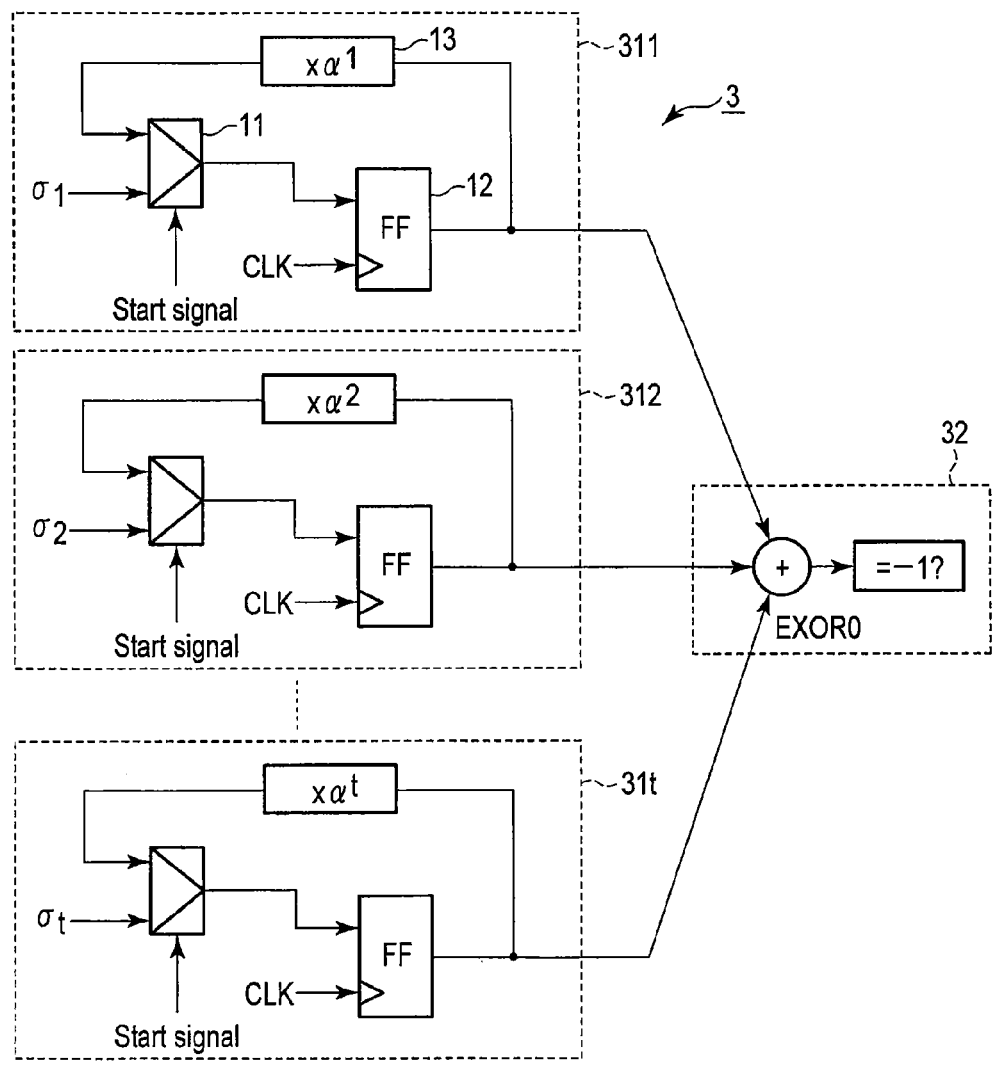
FIG. 3 is a circuit diagram showing the arrangement of an example of a Chien search processing unit.

In general, according to one embodiment, an error correction device includes a syndrome processing unit, a generation unit, and a search processing unit. The syndrome processing unit generates a syndrome value based on received data. The generation unit generates t (t is a maximum number of correctable bits) coefficient values of an error position polynomial based on the syndrome value. The search processing unit calculates a root of the error position polynomial, with a concurrency of computation being equal to or greater than "2", by using the coefficient values of the error position polynomial, when a number of error bits is not more than a predetermined value s ($1 \leq s < t$). The search processing unit calculates the root of the error position polynomial, with a concurrency of computation being "1", by using the coefficient values of the error position polynomial, when the number of error bits exceeds the predetermined value s.

An embodiment will be described below with reference to the accompanying drawings. The same reference numerals denote the same parts in each embodiment.

FIG. 1 shows a processing procedure in a BCH type error correction device to which this embodiment is applied. FIG. 1 shows the schematic arrangement of an error correction device 100.

The error correction device 100 includes a syndrome processing unit 1, an error position polynomial generation unit 2 which generates an error position polynomial, and a Chien search processing unit 3. In the following description, "t" represents the maximum number of bits which can be corrected (also called the number of maximum correction bits) by the error correction device 100 in FIG. 1.

The syndrome processing unit 1 decodes received data including the data and a parity read out from, for example, a NAND flash memory to generate 2t syndrome values $s_1$ to $s_{2t}$. If all syndrome values $s_1$ to $s_{2t}$ are zero, there is no error. In contrast, the presence of a syndrome value which is not zero indicates that the received data includes one or more errors.

The error position polynomial generation unit 2 calculates sigma values $\sigma_1$ to $\sigma_t$ by, for example, the Peterson method, Euclidian method, or BM method by using syndrome values $s_1$ to $s_{2t}$ and generates an error position polynomial $\sigma(z)$. The $\sigma$ values $\sigma_1$ to $\sigma_t$ are coefficients of the error position polynomial $\sigma(z)$ represented by equation (1) given below:

$$\sigma(z) = 1 + \sigma_1 z + \sigma_2 z^2 + \ldots + \sigma_t z^t \quad (1)$$

$$= 1 + \sum \sigma_k z^k \quad (2)$$

The error position polynomial generation unit 2 can also estimate the number of error bits in received data based on the highest order of the error position polynomial $\sigma(z)$. A number of error bits estimated value calculated by the error position polynomial generation unit 2 is supplied to the Chien search processing unit 3.

FIG. 2 is a view showing the relationship between the number of error bits estimated value and sigma values $\sigma_1$ to $\sigma_t$. As shown in FIG. 2, letting k (k is an integer less than or equal to t) be the number of error bits estimated value, the $\sigma$ values $\sigma_1$ to $\sigma_k$ are values other than "0", and $\sigma_{(k+1)}$ to $\sigma_t$ are "0".

Referring back to FIG. 1, the Chien search processing unit 3 detects an error position by calculating the root of the error position polynomial σ(z) by Chien search processing. Chien search processing is a technique of sequentially substituting a power $\alpha^i$ (i is a natural number not less than 1) of σ into the error position polynomial σ(z) to check whether an error position polynomial $\sigma(\alpha^i)$ is zero. Since $\alpha^i$ one-to-one corresponds to an error position, it is possible to detect an error position by calculating the root of the error position polynomial σ(z). Note that α is the primitive root of a Galois field $GF(m^q)$.

FIG. 3 is a circuit diagram showing an example of the Chien search processing unit 3. The Chien search processing unit 3 is a circuit which processes a 1-bit address per clock. This circuit is called a Chien search processing unit with concurrency "1". The Chien search processing unit 3 includes computation units 311 to 31t respectively provided in correspondence with sigma values $\sigma_1$ to $\sigma_t$ and a determination unit 32.

The computation unit 31k (k=1 to t) calculates each term $\sigma_k \alpha^{ik}$ of the error position polynomial $\sigma(\alpha^i)$. The computation unit 31k (k=1 to t) includes a selector 11, a flip-flop circuit 12, and a multiplier 13. The selector 11 supplies sigma values $\sigma_1$ to $\sigma_t$ to the flip-flop circuit 12 in accordance with a start signal, and then supplies the computation result obtained by the multiplier 13 to the flip-flop circuit 12. The flip-flop circuit 12 holds a sigma value $\sigma_k$ (k=1 to t) supplied from the selector 11 in accordance with a clock signal.

If sigma value $\sigma_k$ is 14 bits for example, the flip-flop circuit 12 is constituted by 14 flip-flop circuits. The multiplier 13 is formed by a Galois field multiplier for multiplying an output signal from the flip-flop circuit 12 by $\alpha^k$.

A determination unit 32 includes, for example, an exclusive OR circuit EXOR 0. The determination unit 32 obtains $\Sigma \sigma_k \alpha^{ik}$ by adding the computation results output from the computation units 31k in accordance with clock signals, i.e., the respective terms $\sigma_k \alpha^{ik}$, by using the EXOR0. That is, the determination unit 32 generates second terms of the error position polynomial $\sigma(\alpha^i)$ of equation (2). As a result, if $\Sigma \sigma_k \alpha^i K = -1$, the determination unit 32 determines that $\alpha^i$ is the root of the error position polynomial σ(z). This is because, equation (2) becomes $\sigma(\alpha^i)=0$ when $\Sigma \sigma_k \alpha^{ik}=-1$.

The computation unit 31k of the Chien search processing unit 3 sequentially calculates $\sigma_k \alpha^{ik}$ in the order of i=0, 1, ..., the last reception bit. In other words, if the total number of received data bits is "x", the computation units 31k sequentially calculate the respective terms $\sigma_k \alpha^{ik}$ in the order of i=0, 1, ..., x−1. The determination unit 32 determines whether $\alpha^1$ is the root of the error position polynomial σ(z), every time the computation unit 31k computes $\sigma_k \alpha^{ik}$. Note that if the number of roots obtained is less than the number of error bits estimated value after sequential calculation up to i=last reception bit, the determination unit 32 determines the occurrence of errors that exceed correction performance t, and processes it as errors that cannot be corrected.

Figure 4:
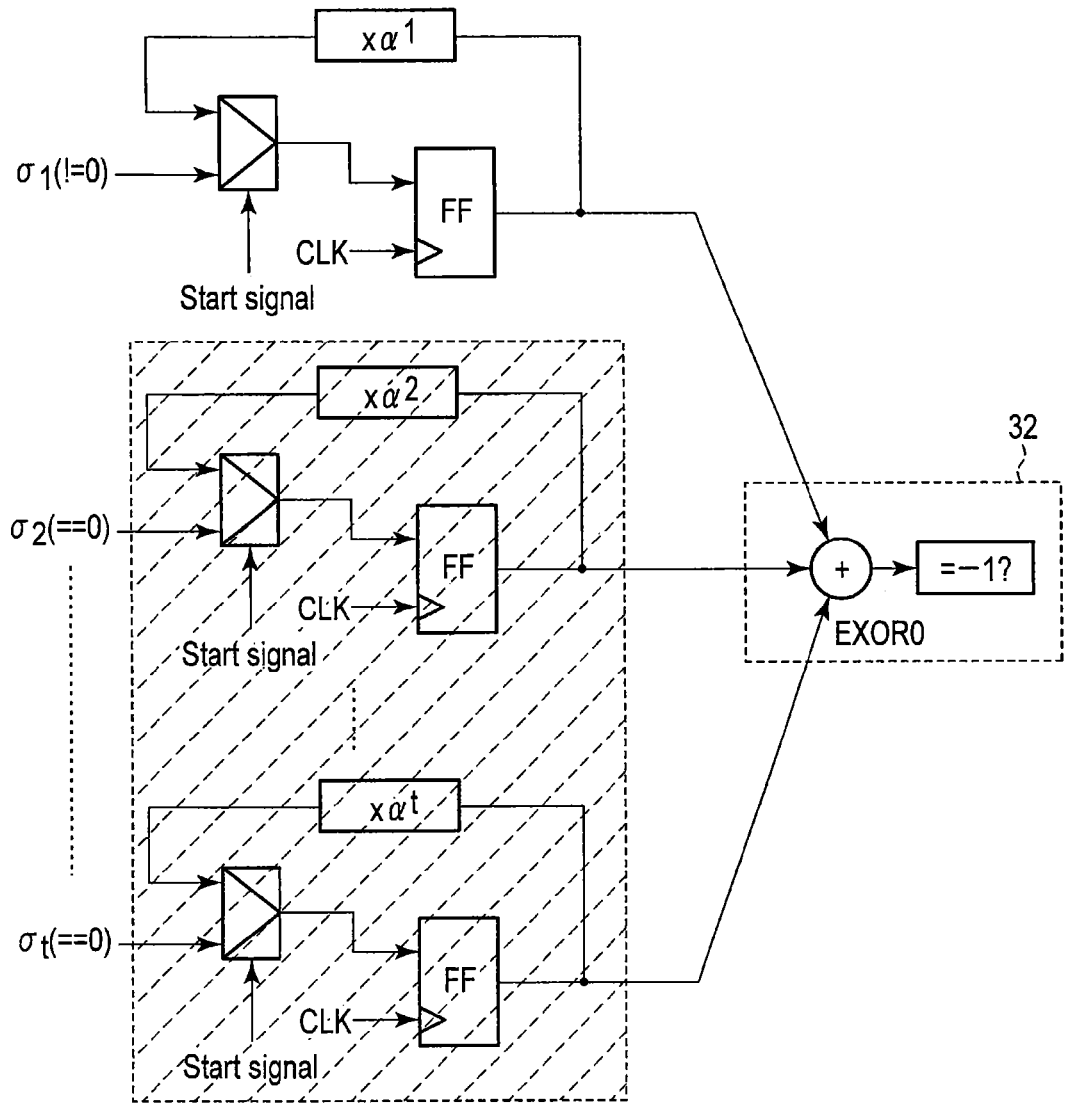
FIG. 4 is a circuit diagram showing a concept of processing performed by a Chien search processing unit 3 when the number of error bits estimated values is "1"

FIG. 4 shows the process concept of the Chien search processing unit 3 when the number of error bits estimation is "1". Referring to FIG. 2, according to the computation results obtained by the computation units 31k (k=1 to t), only $\sigma_1$ exhibits a value other than "0", and $\sigma_2$ to $\sigma_t$ exhibit "0". In this case, even if the computation units 312 to 32t with $\sigma_2$ to $\sigma_t$ perform computation processing, computation results are always "0".

The Chien search processing unit 3 is required to have the following performance.

It is necessary to improve the correction performance, i.e., increase a maximum number of bits t which can be corrected, along with miniaturization of NAND flash memories.

In addition, in order to improve the processing speed, it is required to improve the transfer rate. Along with this requirement, it is necessary to decrease the number of processing cycle of the error correction device.

In addition, since NAND flash memories are often used in mobile devices, there are demands for lower power consumption.

(Increase in Circuit Size with Increase in Maximum of the Number of Bits t which can be Corrected)

Note that increasing the maximum number of bits t which can be corrected will increase the circuit size.

FIG. 5A shows a case in which when the maximum number of bits is t1 at concurrency "1". FIG. 5B schematically shows a case in which the maximum number of bits is increased to t2 (t1<t2) at concurrency "1". In the case shown in FIG. 5B, as flip-flop circuits (F/Fs) and multipliers increase in number, the circuit size increases.

(Increase in Circuit Size with Increase in Concurrency)

FIG. 6 is a circuit diagram showing the arrangement of a Chien search processing unit for processing a 2-bit address per clock. This circuit is called a Chien search processing unit with concurrency "$_2$".

The arrangement shown in FIG. 6 differs from that shown in FIG. 3 in that a first multiplier 14 is connected to the output terminal of the flip-flop circuit 12, and the first multiplier 14 executes multiplication of $x\alpha^N$. A second multiplier 15 is connected between the output terminal of the flip-flop circuit 12 and the input terminal of the selector 11. The second multiplier 15 executes multiplication of $x\alpha^{2N}$ (N=1 to t) at the time of shifting operation. A first determination unit 320 receives the computation result obtained by the flip-flop circuit 12 of each computation unit 31k. A second determination unit 321 receives the computation result obtained by each multiplier 14. The first and second determination units 320 and 321 each are identical to the determination unit 32 shown in FIG. 3.

The Chien search processing unit with concurrency "2" shown in FIG. 6 can decrease the number of Chien search processing cycle to half that of the Chien search processing unit with concurrency "1" as shown in FIG. 3. Increasing the concurrency can decrease the number of Chien search processing cycle and implement high-speed processing. Increasing the concurrency, however, will increase the circuit size.

FIG. 7A is a schematic view showing a case of concurrency "1" with the number of maximum correction bits t. FIG. 7B is a schematic view showing a case of concurrency "2" with the number of maximum correction bits t.

As described above, as the concurrency increases, the number of multipliers increases. For this reason, this also increases the circuit size.

(Increase in Current Consumption with Increase in Circuit Size)

As described above, by increasing the number of maximum correction bits t and increasing the concurrency, the circuit size and current consumption are increased. For this reason, for example, the current consumed by a portable device in which a NAND flash memory is mounted may exceed the current rating value based on various types of specifications.

Figure 8:
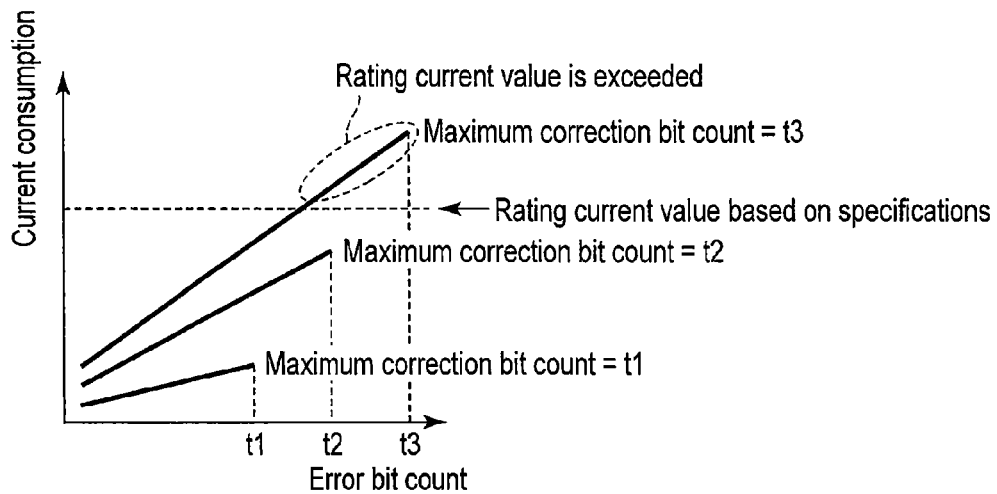
FIG. 8 is a graph showing the relationship between current consumptions, the number of error bits, and the number of maximum correction bits.

FIG. 8 is a graph showing the relationship between current consumptions, the number of error bits, and the number of maximum correction bits. Referring to FIG. 8, the relationship between the number of maximum correction bits is defined as t1<t2<t3. FIG. 8 indicates that as the number of maximum correction bits increases, the current consumption increases even with the same number of error bits. Referring to FIG. 8, at the number of maximum correction bits t3, as the number of error bits increases, the current consumption exceeds the rating current value.

Figure 9:
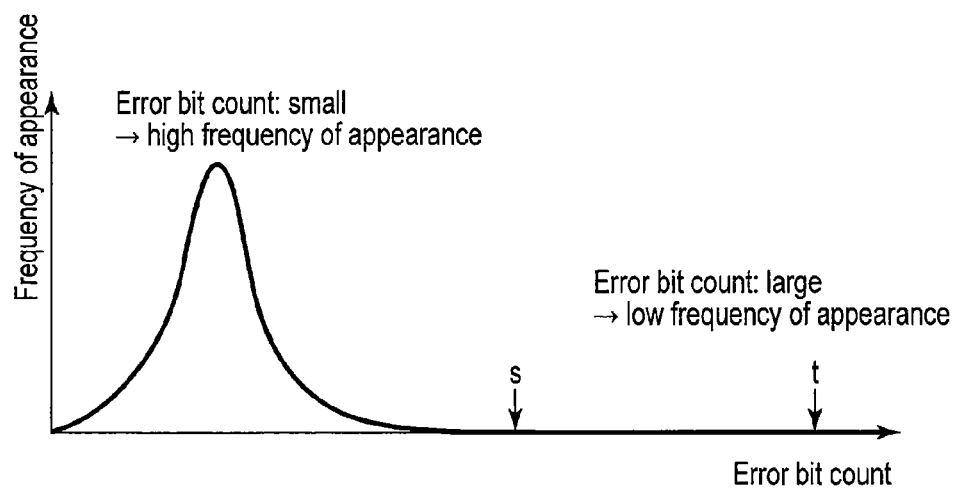
FIG. 9 is a graph showing an example of the distribution of the number of error bits in a NAND flash memory.

FIG. 9 shows an example of the number of error bits distribution of the NAND flash memory. Referring to FIG. 9, "t" represents the number of maximum correction bits, and the predetermined value "s" is a constant (integer) defined by 1<=s<t. As shown in FIG. 9, in the NAND flash memory, the frequencies of appearance are disproportionately higher on the side where the number of error bits are small, which are smaller than the predetermined value "s". For this reason, the frequencies of appearance are very low on the side where the number of error bits is greater than the predetermined value "s". Therefore, the circuits for computing signals near $\sigma_t$ are rarely used.

EMBODIMENT

Figure 10:
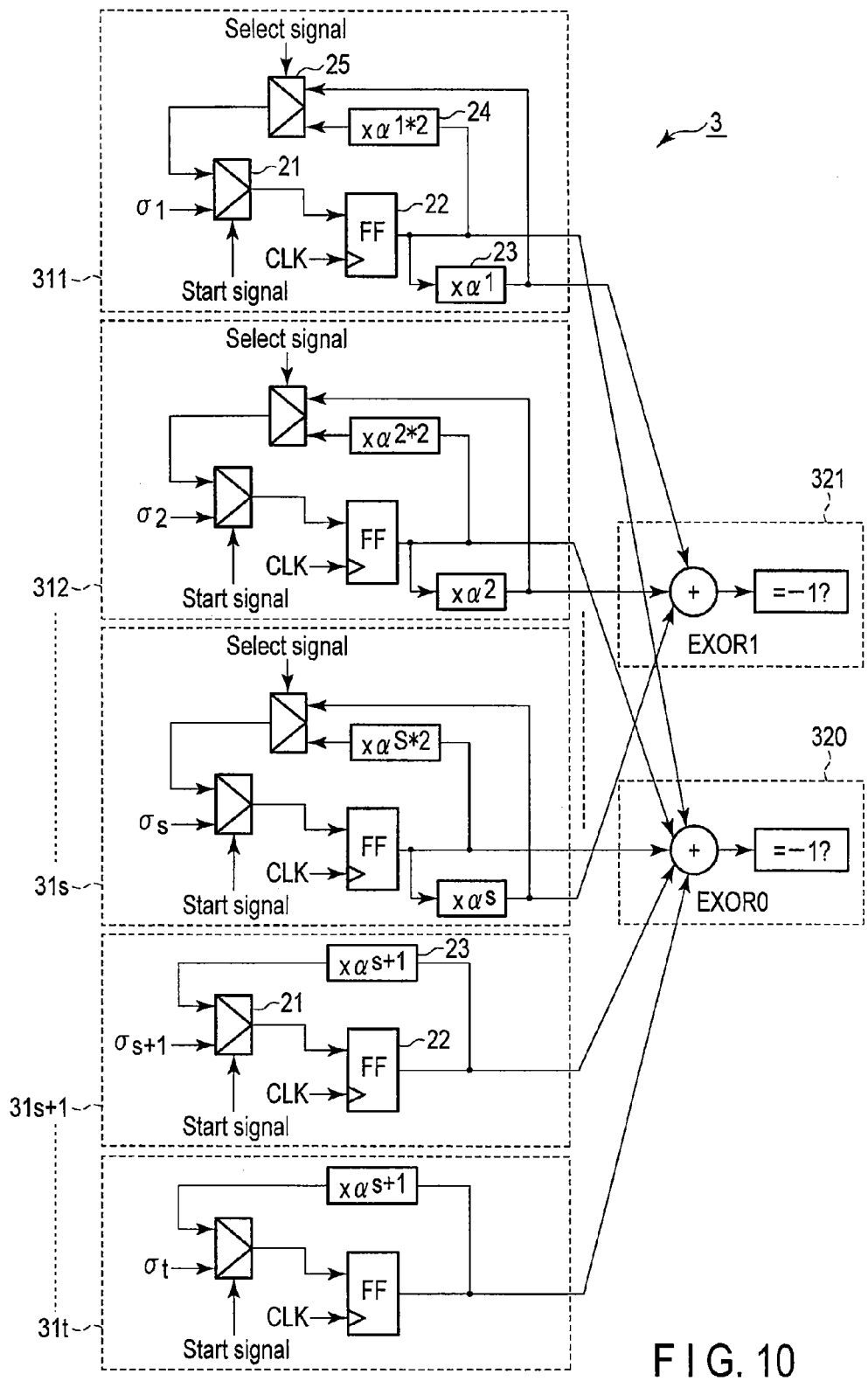
FIG. 10 is a circuit diagram showing the arrangement of a Chien search processing unit according to this embodiment.

FIG. 10 shows a Chien search processing unit 3 according to this embodiment.

The Chien search processing unit 3 is configured based on the number of error bits distribution of the NAND flash memory shown in FIG. 9. This embodiment is configured based on the consideration of the number of error bits distribution such that when the number of error bits, i.e., the number of error bits estimated values shown in FIG. 1, exceeds the predetermined value "s", the concurrency of the Chien search processing unit is decreased to reduce the circuit size and current consumption.

The Chien search processing unit according to this embodiment functions as a circuit with concurrency "2" which performs processing in 2 bits per clock when the number of error bits is 1 to s, and functions as a circuit with concurrency "1" which performs processing in 1 bit per clock when the number of error bits is s+1 to t. Unlike the example shown in FIG. 6, the Chien search processing unit according to this embodiment uses the two multipliers when the number of error bits is 1 to s, and uses only one multiplier when the number of error bits is s+1 to t. An EXOR0 of a first determination unit 320 which determines the computation result obtained with concurrency "1" receives the computation results obtained with sigma values $\sigma_1$ to $\sigma_t$. In contrast to this, an EXOR1 of a second determination unit 321 which determines the computation result obtained with concurrency "2" receives only the computation results obtained with sigma values $\sigma_1$ to $\sigma_s$, but receives no computation results obtained with $\sigma_{(s+1)}$ to $\sigma_t$.

With regard to the connection of the EXOR1, according to the example shown in FIG. 2 or 4, if the number of error bits estimation is less than or equal to the predetermined value s, since the computation results obtained by Chien search processing with $\sigma_{(s+1)}$ to $\sigma_t$ are always "0", no problem arises even if the EXOR1 receives none of the computation results with $\sigma_{(s+1)}$ to $\sigma_t$.

The arrangement of the Chien search processing unit 3 according to this embodiment will be described with reference to FIG. 10.

The Chien search processing unit 3 includes first computation units 311 to 31s, second computation units 31s+1 to 31t, and determination units 320 and 321. In this case, as described above, "t" represents the number of maximum correction bits, and the predetermined value "s" is a constant defined by 1<=s<t.

The first computation units 311 to 31s are respectively provided for sigma values $\sigma_1$ to $\sigma_s$ and compute sigma values $\sigma_1$ to $\sigma_s$. The first computation units 311 to 31s are configured to selectively switch the concurrency between "2" and "1".

The second computation units 31s+1 to 31t are respectively provided for sigma values $\sigma_{(s+1)}$ to $\sigma_t$ and compute sigma values $\sigma_{(s+1)}$ to $\sigma_t$. The concurrencies of the second computation units 31s+1 to 31t are set to, for example, "1".

The first computation units 311 to 31s have the same arrangement, and hence the arrangement will be described by using the first computation unit 311. The second computation units 31s+1 to 31t have the same arrangement, and hence the arrangement will be described by using the second computation unit 31s+1.

The first computation unit 311 includes first and second selectors 21 and 25, a flip-flop circuit 22, a first multiplier 23, and a second multiplier 24. Sigma value $\sigma_1$ is supplied to one input terminal of the first selector 21. A signal from the output terminal of the first selector 21 is supplied to the flip-flop circuit 22. If a sigma value $\sigma_k$ is 14 bits, the flip-flop circuits 22 include 14 flip-flop circuits.

An output signal from the flip-flop circuit 22 is connected to the first and second multipliers 23 and 24. The first and second multipliers 23 and 24 are formed from, for example, Galois field multipliers which multiply an output signal from the flip-flop circuit 22 by $\alpha^i$ and $\alpha^{2i}$.

The output terminals of the first and second multipliers 23 and 24 are connected to the input terminals of a second selector 25. The output terminal of the second selector 25 is connected to the other input terminal of the first selector 21.

The second selector 25 selects one of the first and second multipliers 23 and 24 in accordance with a select signal. A select signal is switched in accordance with the predetermined value "s" shown in FIG. 9. In the range (1<=s) in which the number of error bits is less than or equal to the predetermined value "s", an output signal from the second multiplier 24 is selected. In the range (s<t) in which the number of error bits exceeds the predetermined value "s", an output signal from the first multiplier 23 is selected.

On the other hand, the first computation unit 31s+1 has an arrangement similar to that shown in FIG. 3, and includes the selector 21 as the third selector, the flip-flop circuit 22, and the multiplier 23 as the third multiplier. The multiplier 23 performs 1-bit computation per clock signal.

The EXOR0 of the first determination unit 320 which determines a computation result with concurrency "1" receives computation results with sigma values $\sigma_1$ to $\sigma_t$. That is, the EXOR0 receives output signals from the flip-flop circuits 22 of the first and second computation units 311 to 31t.

In contrast to this, the EXOR1 of the second determination unit 321 which determines a computation result with concurrency "2" receives only computation results with sigma values $\sigma_1$ to $\sigma_s$. That is, the EXOR1 receives only output signals from the multipliers 23 of the first computation units 311 to 31s.

In the Chien search processing unit 3 having the above arrangement, when the number of error bits is less than or equal to the predetermined value "s", the second selector 25 selects the second multiplier 24 based on a select signal. Therefore, the first computation units 311 to 31s compute sigma values with concurrency "2". At this time, although the second computation units 31s+1 to 31t multiply sigma values by $\alpha^i$ with concurrency "1", the computation results are "0".

Note that if the number of error bits is less than or equal to the predetermined value "s", it is possible to reduce the current consumption by stopping the second computation units 31s+1 to 31t.

If the concurrency is "2", the second determination unit 321 generates second terms of the error position polynomial $\sigma(\alpha^i)$ expressed by equation (2) by adding computation results, of the computation results supplied from the first computation units 311 to 31s, which are obtained when "i" is an odd number. As a result, if $\Sigma\sigma_k\alpha^{ik}=-1$, the second determination unit 321 determines that $\alpha^i$ is the root of the error position polynomial $\sigma(z)$.

If the concurrency is "2", the first determination unit 320 generates second terms of the error position polynomial $\sigma(\alpha^i)$ expressed by equation (2) by adding computation results, of the computation results supplied from the first and second computation units 311 to 31t, which are obtained when "i" is an even number. As a result, if $\Sigma\sigma_k\alpha^ik=-1$, the first determination unit 320 determines that $\alpha^i$ is the root of the error position polynomial $\sigma(z)$.

If the concurrency is "1", the first determination unit 320 generates second terms of the error position polynomial $\sigma(\alpha^i)$ expressed by equation (2) by adding computation results, of the computation results supplied from the first and second computation units 311 to 31t, which are obtained when "i" is an odd number and an even number. As a result, if $\Sigma\sigma_k\alpha^ik=-1$, the first determination unit 320 determines that $\alpha^i$ is the root of the error position polynomial $\sigma(z)$.

According to this embodiment described above, if the number of error bits is less than or equal to the predetermined value "s", the first and second determination units 320 and 321 perform computation processing with concurrency "2". If the number of error bits exceeds the predetermined value "s", the first determination unit 320 performs computation processing with concurrency "1". For this reason, if the number of error bits with a high frequency of appearance is small, it is possible to perform high-speed processing with concurrency "2". If the number of error bits with a low frequency of appearance is large, it is possible to reliably perform correction with concurrency "1" up to the number of maximum correction bits t.

Furthermore, according to the above embodiment, the first computation units 311 to 31s have concurrency "2", and the second computation units 31s+1 to 31t have concurrency "1". For this reason, letting only the first computation units 311 to 31s have concurrency "2" can reduce the circuit area as compared with a case in which all the units shown in FIG. 7B have concurrency "2".

Figure 11:
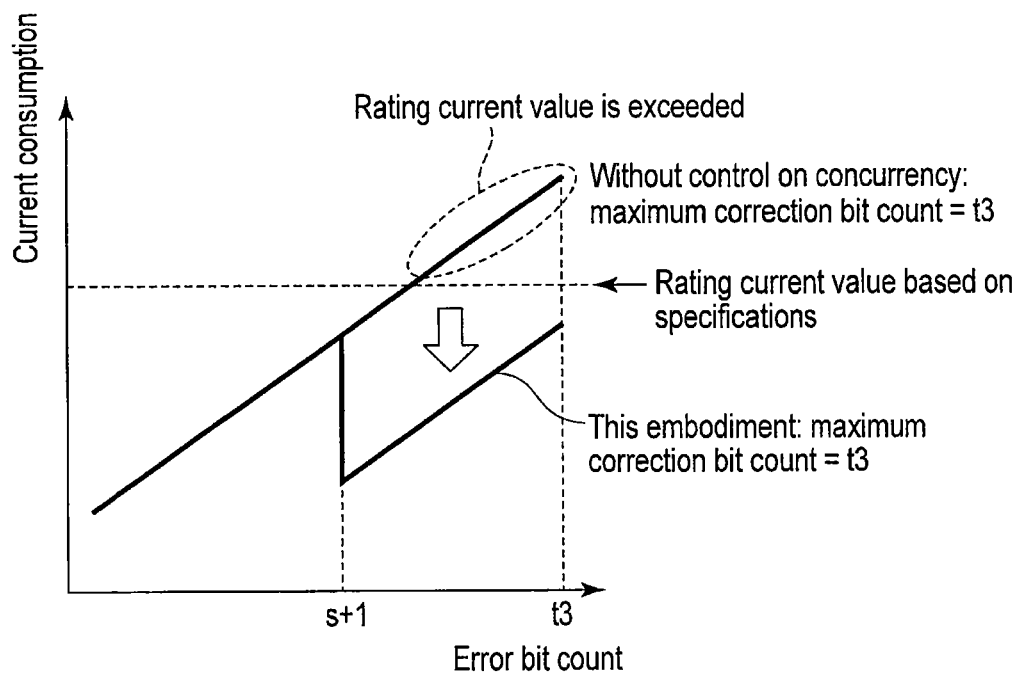
FIG. 11 is a graph showing the current consumption of the Chien search processing unit according to this embodiment.

FIG. 11 shows the relationship between, for example, the rating current of a portable device, current consumptions, the number of error bits, and the number of maximum correction bits according to this embodiment. Unlike FIG. 8, FIG. 11 shows only the number of maximum correction bits t3. As shown in FIG. 11, since computation processing with concurrency "2" is executed from the number of error bits "1" to the number of error bits "(s+1)", the current consumption increases. If no concurrency control is performed after the number of error bits "(s+1)", the current consumption exceeds the rating current value. In this embodiment, however, since computation processing is executed with concurrency "1", the current consumption decreases. For this reason, even when the number of error bits is t3, the current consumption is less than or equal to the rating current. That is, it is possible to reduce the current consumption.

In this embodiment described above, if the number of error bits is less than or equal to the predetermined value "s", the first computation units 311 to 31s have concurrency "2". However, the embodiment is not limited to this, and computation units can be constituted by computation circuits with concurrency "4", "8", or more as long as the circuit area allows.

In addition, in the above embodiment, although one predetermined value "s" is set as the predetermined value of the number of error bits, the embodiment is not limited to this. For example, the predetermined values "s" and "s+n" (s<n<t) are set as the predetermined values of the number of error bits based on the number of error bits estimations. For example, it is possible to set concurrency "4" for the number of error bits "1" to "s", concurrency "2" for the number of error bits "s+1" to "n", and concurrency "1" for the number of error bits "n+1" to "t".

In addition, although the application of this embodiment to the NAND flash memory has been described, each embodiment described above can be applied to other types of storage devices, communication devices, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An error correction device comprising:
a syndrome processing unit configured to generate a syndrome value based on received data;
a generation unit configured to generate t (t is a maximum number of correctable bits) coefficient values of an error position polynomial based on the syndrome value; and
a search processing unit configured to calculate a root of the error position polynomial, with a concurrency of computation being equal to or greater than "2", by using the coefficient values of the error position polynomial, when a number of error bits is not more than a predetermined value s (1<=s<t), the search processing unit calculating the root of the error position polynomial, with a concurrency of computation being "1", by using the coefficient values of the error position polynomial, when the number of error bits exceeds the predetermined value s.

2. The device according to claim 1, wherein the search processing unit comprises:
s first computation units to which one of s (1<=s<t) coefficient values of the t coefficient values is supplied;
t-s second computation units to which one of t-s coefficient values of t coefficient values is supplied;
a first determination unit configured to calculate the root of the error position polynomial from computation results obtained by the first computation unit and the second computation unit; and
a second determination unit configured to calculate the root of the error position polynomial from a computation result obtained by the first computation unit.

3. The device according to claim 2, wherein each of the s first computation units comprises:
a first selector including a first input terminal, a second input terminal, and a first output terminal, the first input terminal receiving one of 1 to s coefficient values;
a first flip-flop circuit including a third input terminal and a second output terminal, the third input terminal being connected to the first output terminal of the first selector;

a first multiplier connected to the second output terminal of the first flip-flop circuit, the first multiplier multiplying one of the s coefficient values by $\alpha^i$ (i is a natural number not less than 1);

a second multiplier connected to the second output terminal of the first flip-flop circuit, the second multiplier multiplying one of the coefficient values "s" by $\alpha^{ik}$ (k is a natural number not less than 1); and a second selector including a fourth input terminal, a fifth input terminal, and a third output terminal, the second selector receiving multiplication results obtained by the first multiplier and the second multiplier via the fourth input terminal and the fifth input terminal, and the third output terminal being connected to the third input terminal of the first selector and selecting the first multiplier and the second multiplier based on the predetermined value "s".

4. The device according to claim 2, wherein each of the t–s second computation units comprises:

a third selector including a sixth input terminal, a seventh input terminal, and a fourth output terminal, the sixth input terminal receiving one of the t–s coefficient values;

a second flip-flop circuit including an eighth input terminal and a fifth output terminal, the eighth input terminal being connected to the fourth output terminal of the third selector; and a third multiplier connected between the output terminal of the second flip-flop circuit and the seventh input terminal of the third selector, the third multiplier multiplying one of the t–s coefficient values by $\alpha^i$.

5. The device according to claim 3, wherein the first determination unit receives a computation result obtained by the second multiplier.

6. The device according to claim 3, wherein the second determination unit receives computation results obtained by the first multiplier and the third multiplier.

7. The device according to claim 1, wherein the received data comprises data read out from a NAND flash memory.

8. An error correction method comprising:

generating a syndrome value based on received data;

generating t (t is a maximum number of correctable bits) coefficient values of an error position polynomial based on the syndrome value; and calculating a root of the error position polynomial, with a concurrency of computation being greater than 2, by using the coefficient values of the error position polynomial, when a number of error bits is not more than a predetermined value s ($1<=s<t$), and calculating the root of the error position polynomial, with a concurrency of computation being "1", by using the coefficient values of the error position polynomial, when the number of error bits exceeds the predetermined value s.

9. The method according to claim 8, wherein the received data comprises data read out from a NAND flash memory.

* * * * *